United States Patent [19]

Makiuchi

[11] Patent Number: 5,932,114

[45] Date of Patent: Aug. 3, 1999

[54] INTEGRATED OPTICAL MODULE INCLUDING A WAVEGUIDE AND A PHOTORECEPTION DEVICE

[75] Inventor: Masao Makiuchi, Kawasaki, Japan

[73] Assignee: Fujitsu Limited, Kanagawa, Japan

[21] Appl. No.: 08/928,718

[22] Filed: Sep. 12, 1997

Related U.S. Application Data

[62] Division of application No. 08/552,474, Nov. 9, 1995, Pat. No. 5,701,374.

[30] Foreign Application Priority Data

May 12, 1995 [JP] Japan ................................. 7-114629

[51] Int. Cl.$^6$ .................................................. B02B 6/00
[52] U.S. Cl. .............................. 216/24; 216/53; 216/95; 216/99; 438/65; 438/68; 438/69; 438/71; 438/72
[58] Field of Search ................................ 216/24, 53, 95, 216/99; 438/65, 68, 69, 71, 72

[56] References Cited

U.S. PATENT DOCUMENTS

| | | | |
|---|---|---|---|
| 4,358,676 | 11/1982 | Childs et al. | 250/211 J |
| 4,772,787 | 9/1988 | Trommer | 250/227 |
| 4,969,712 | 11/1990 | Westwood et al. | 216/24 |
| 5,122,652 | 6/1992 | Stein | 250/216 |
| 5,128,282 | 7/1992 | Ormond et al. | 437/226 |
| 5,196,378 | 3/1993 | Bean et al. | 437/226 |
| 5,218,223 | 6/1993 | Spaeth et al. | 257/436 |
| 5,309,468 | 5/1994 | Makiuchi | 372/50 |

FOREIGN PATENT DOCUMENTS

| | | |
|---|---|---|
| 3914835 C1 | 7/1990 | Germany. |
| 4301455 A1 | 5/1994 | Germany. |
| 4301456 C1 | 6/1994 | Germany. |
| 63-205611 | 8/1988 | Japan. |
| 2213957 | 8/1989 | United Kingdom. |

OTHER PUBLICATIONS

Furuya, K. et al, "Crystallographic facets chemically etched in GaInAsP/InP for integrated optics" Electronics Letters, 17 (17) pp. 582–583, Aug. 1981.
Patent Abstract of Japan, Pub. No. 05093827, Apr. 16, 1993, Sumitomo Electric Ind. Ltd. Paris Preliminary Search Report, Appln. No. 951410900, Jun. 22, 1998.

*Primary Examiner*—Richard Bueker
*Attorney, Agent, or Firm*—Armstrong, Westerman, Hattori, McLeland & Naughton

[57] ABSTRACT

An optical module includes support substrate, an optical waveguide on the support substrate, a photoreception device on the support substrate, an optical path conversion part for converting an optical path of an optical beam guided through the optical waveguide from a first optical path to a second optical path that leads to a photodetection area of said photoreception device, wherein the optical path conversion part is provided on the photodetection device as a part thereof, such that the optical beam emitted from the optical waveguide impinges upon the photodetection area of the photoreception device.

2 Claims, 15 Drawing Sheets

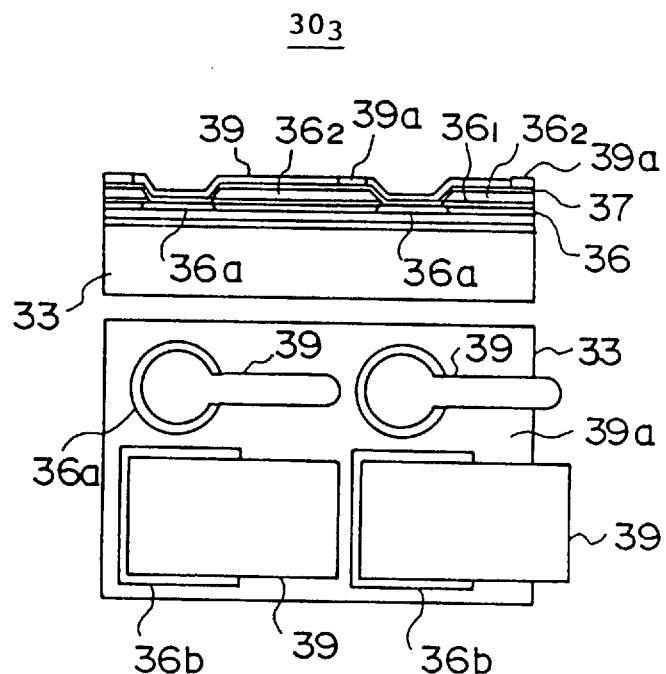
FIG. 16E
FIG. 16F
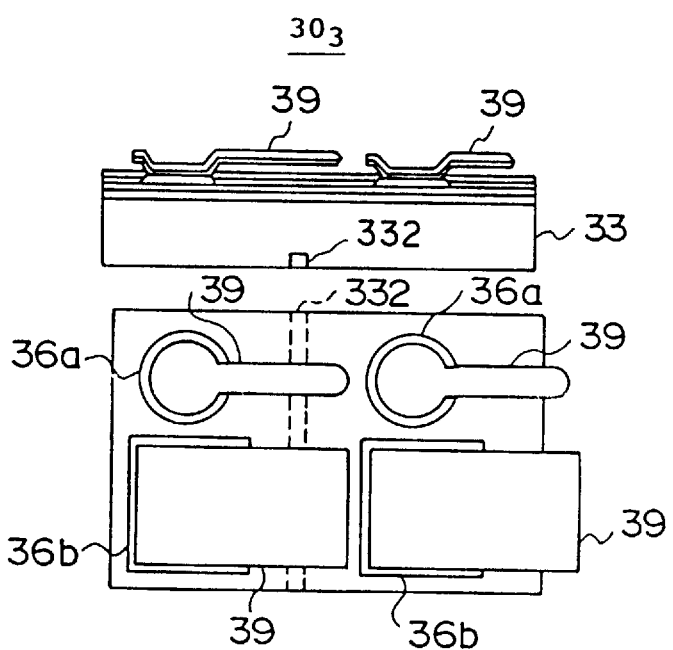
FIG. 16G
FIG. 16H

INTEGRATED OPTICAL MODULE INCLUDING A WAVEGUIDE AND A PHOTORECEPTION DEVICE

This is a divisional of application Ser. No. 08/552,474 filed Nov. 9, 1995, now U.S. Pat. No. 5,701,374.

BACKGROUND OF THE INVENTION

The present invention generally relates to optical semiconductor devices and more particularly to an integrated optical module that includes a photoreception device and an optical waveguide integrated with each other.

Semiconductor photodetection devices are indispensable in optical information processing systems for use in the field of so-called multimedia where image data and audio data are processed as a part of the information signals processed by the system. In such optical information processing systems, it is essential to achieve efficient optical coupling between an optical waveguide used for transmitting optical signals and a photoreception device used in an optical module for detecting optical signals transmitted through the optical waveguide.

On the other hand, in order that such multimedia is accepted widely by human society, it is necessary to provide the optical processing systems with low cost while achieving efficient optical coupling between the optical waveguide and the corresponding photoreception device.

FIG. 1 shows the construction of a conventional photodetection module proposed previously by the inventor of the present invention.

Referring to FIG. 1, the photodetection module is constructed upon a support substrate 1 that carries thereon wiring patterns 1a and 1b, wherein the wiring patterns 1a and 1b are connected to a semiconductor photoreception device 10 mounted upon the support substrate 1 by way of a flip-chip process.

The photoreception device 10 includes a substrate 2 of n-type InP on which a buffer layer 3 of n-type InP is provided, wherein the buffer layer 3 carries thereon an undoped layer 4 of InGaAs and a layer 5 of n⁻-type InP formed on the InGaAs layer 4. Further, p-type diffusion regions 5a and 5b are formed in the foregoing InP layer 5. As a result, it will be noted that pin diodes D1 and D2 are formed in correspondence to the diffusion regions 5a and 5b.

FIG. 2 shows an equivalent circuit diagram of the diodes D1 and D2.

Referring to FIG. 2, it will be noted that the diodes D1 and D2 are connected in series via the n-type InP layer 3 with mutually opposing polarities, wherein the diode D1 forms a drive circuit that drives the diode D2. More specifically, the diode D1 causes a reverse biasing in the diode D2 when the diode D1 itself is forward biased, wherein the diode D2 thus reverse biased in turn causes a conduction in response to an incident optical beam. In other words, the diode D2 acts as a photodiode. It should be noted that the p-type region 5a corresponding to the drive diode D1 has a substantially larger area than the p-type region 5b forming the photodiode D2. Thus, the drive diode D1 can supply a large drive current to the photodiode D2. Associated with such a large area of the p-type region 5a, the drive diode D1 has a large junction capacitance Cp, while the photodiode D2 has a very small junction capacitance associated with the small area of the p-type region 5b. Thus, the photodiode D2 shows a very high response against incident optical beam.

In the photoreception device 10 of FIG. 1, it should be noted that the substrate 2 carries a microlens 2a on the rear side in correspondence to the foregoing photodiode D2, such that the optical beam incident to the rear side of the substrate 2 from an optical fiber 11 is focused upon a part of the InGaAs layer 4 located above the p-type region 5b. Further, the photoreception device 10 includes an insulation film 6 covering the surface of the n-type InP layer 5, wherein the insulation film 6 is formed with contact holes 6a and 6b respectively in correspondence to the diffusion regions 5a and 5b. Further, metal bumps 7a and 7b are formed on the diffusion regions 5a and 5b respectively in correspondence to the contact holes 6a and 6b. Thereby, the photoreception device 10 is mounted upon the support substrate 1 in an inverted or turned-over state by way of a flip-chip process to form the photodetection module, and the metal bumps 7a and 7b are connected electrically as well as mechanically to the foregoing conductor patterns 1a and 1b on the support substrate 1.

In the illustrated construction, it should be noted that another conductor pattern 1c is provided on the rear side of the support substrate 1 in electrical connection with the conductor pattern 1a or 1b by way of a via hole 1d, wherein the conductor pattern 1c is connected to a d.c. current source 12 that supplies a positive voltage. Further, an output terminal and a load resistance $R_L$ are connected to the conductor pattern 1b. As a result, a circuit is formed as indicated in FIG. 2 in which the diode D1 is forward biased and the photodiode D2 is reversely biased. In FIG. 1, it should further be noted that the rear side of the InP substrate 2 carries an anti-reflection film 8.

In the construction of FIG. 1, the photoreception device 10 is mounted upon the support substrate 1 with low cost and with reliability by employing the flip-chip process. Thereby, the fabrication cost of the photodetection module is reduced substantially. Further, by reducing the area of the diffusion region 5b that forms the essential part of the photodiode D2, the response of the photodiode D2 is improved substantially. Further, such a construction of FIG. 1 is advantageous for eliminating mechanical stress from being applied to the active region of the photodiode D2 which is essential for the detection of the incident optical beam. In the structure of FIG. 1, most of the external mechanical stresses applied to the module is absorbed by the diffusion region 5a of the drive diode D1 that has a much larger area than the photodiode D2.

On the other hand, the photodetection module of FIG. 1 has a drawback in that it is necessary to provide a separate holding mechanism for holding the optical fiber 11 in alignment with the microlens 2a on the substrate 2, while such a holding mechanism has to be adjusted for each of the photoreception devices 10 such that an optimum optical coupling is achieved between the core of the optical fiber 11 and the microlens 2a. As the core of an optical fiber has a diameter of about 6 μm at best, such an adjustment of the holding mechanism of the optical fiber 11 takes a substantial time. It should be noted that the adjustment of the fiber holding mechanism has to be made by monitoring the output of the photodiode D2 in search of the optimum position where the output of the photodiode D2 becomes maximum. Thereby, because of the long time needed for the adjustment, the fabrication cost of device increases inevitably in the optical module of FIG. 1.

On the other hand, there are proposals for optical modules that does not require such a holding mechanism of optical fiber as indicated in FIG. 3, wherein those parts corresponding to the parts described previously are designated by the same reference numerals and the description thereof will be omitted.

Referring to FIG. 3, there is provided an optical waveguide 13 on the upper major surface of the support substrate 1, wherein the optical waveguide 13 is formed monolithically upon the substrate 1 and includes a waveguide layer 13c sandwiched vertically by a pair of cladding layers 13a and 13b. Further, a mirror element 14 having a mirror surface 14a is provided in the path of the optical beam emitted from an edge surface 13A of the foregoing waveguide layer 13c. It should be noted that the mirror element 14 has a lower major surface contacting to the upper major surface of the support substrate 1 and an upper major surface parallel to the foregoing lower major surface, and the photoreception device 10 is carried upon the upper major surface of the mirror element 14.

In such a construction, the optical beam guided through the optical waveguide 13 and emitted from the edge surface 13A, is reflected by the mirror surface 14a and impinges upon the rear surface of the substrate 2 of the photoreception device 10, wherein the optical beam thus entered into the substrate 2 reaches the active region of the photodiode D2 that corresponds to the diffusion region 5b.

Thus, by providing the mirror element 14 at a predetermined position of the support substrate 1 and by providing the photoreception device 10 at a predetermined position of the upper major surface of the substrate 1, it is possible to achieve an optical coupling between the optical waveguide 13 and the photodiode D2 of the photoreception device 10 easily, by merely aligning the photoreception device 10, the mirror element 12 and the optical waveguide 12 with each other on the substrate 1. It should be noted that such a positional alignment may be achieved easily by forming alignment marks on the substrate 1 or on the mirror element 14.

The construction of FIG. 3, however, has a drawback in that it requires the mirror element 14 as an additional component. Associated with this, the construction of FIG. 3 requires additional fabrication steps. Further, use of such a mirror element 14 tends to cause modification of the optical beam path in the optical integrated circuit. In order to achieve an optimum optical coupling between the photodiode D2 and the optical waveguide 13, it is necessary to adjust both the mirror element 14 and the photodetection device 10 with respect to the optical waveguide 13, while such an adjustment is extremely difficult particularly when the precision of the mirror element 14 is insufficient.

Further, use of such a mirror element 14 in the optical path of the optical beam tends to increase the optical path length of the optical beam emitted from the edge surface 13A of the optical waveguide 13. When the optical path length of the optical beam is increased, the optical beam experiences a substantial beam divergence when it reaches the active region of the photodiode D2. In such a case, it is necessary to increase the size of the active region of the photodiode D2 in correspondence to the increased beam diameter of the optical beam, while such an increase in the size of the active region of the photodiode D2 invites an increase in the junction capacitance of the diffusion region 5b that forms the active region of the photodiode D2. Thereby, the response of the photodiode D2 is inevitably deteriorated. When the size of the active region 5b of the photodiode D2 is to be set small for maintaining high response speed, on the other hand, the efficiency of optical coupling of the photodiode D2 is degraded substantially due to the fact that most part of the optical beam from the optical waveguide 13 misses the active region 5b of the photodiode D2.

FIG. 4 shows the construction of another conventional photodetection device, wherein those parts described previously are designated by the same reference numerals and the description thereof will be omitted.

Referring to FIG. 4, it will be noted that the photoreception device 10 is now flip-chip mounted directly upon the upper major surface of the support substrate 1 that carries also the optical waveguide 13 thereon as an integral, monolithic body. In such a construction, the edge surface of the active layer 4 formed on the InP substrate 2 faces the exposed edge surface 13A of the waveguide layer 13c, and the optical beam emitted from the edge surface 13A directly enters into the active layer 4. Thereby, the problem of increased optical path distance of the optical beam is successfully eliminated.

On the other hand, such a construction also has a drawback in that most part of the optical beam emitted from the optical waveguide layer 13c, which typically has a thickness of about 6 $\mu$m, misses the active layer 4 that has a thickness of only 2–3 $\mu$m. It should be noted that the optical beam emitted from the optical waveguide layer 13c has a size corresponding to the thickness of the layer 13c in the vertical direction. In other words, the construction of FIG. 4 inherently provides a large optical loss and cannot provide a satisfactory optical coupling.

In addition, the construction of FIG. 4 requires adjustment process between the photodetection device and the external optical waveguide layer 13 on the substrate 1, for maximizing the optical coupling between the active layer of the photoreception device 10 and the optical waveguide 13, while such an adjustment is complex and increases the cost of the optical module.

SUMMARY OF THE INVENTION

Accordingly, it is a general object of the present invention to provide a novel and useful optical module as well as to a fabrication process thereof wherein the foregoing problems are eliminated.

Another and more specific object of the present invention is to provide an optical module suitable for optimizing optical coupling between a photoreception device and an optical waveguide, without carrying out complex adjustment process, such as the one that seeks for a maximum in the output of the photodetection device.

Another object of the present invention is to provide an optical module, comprising:

a support substrate;

an optical waveguide provided on said support substrate for guiding an optical beam therethrough;

a photoreception device provided on said support substrate, said photoreception device including a photodetection area that responds to an incoming optical beam;

optical path conversion means for converting an optical path of said optical beam guided through said optical waveguide and emitted therefrom, from a first optical path to a second optical path that leads to said photodetection area of said photoreception device;

said optical waveguide having an edge surface for emitting said optical beam guided through said optical waveguide, along said first optical path;

said photoreception device being provided on said support substrate so as to be hit by said optical beam emitted from said edge surface of said optical waveguide;

said optical path conversion means being formed on said photodetection device as a part thereof, such that said optical beam emitted from said edge surface of said optical waveguide impinges upon said photodetection area of said photoreception device.

According to the present invention, the optical path conversion means is formed on the photoreception device, which in turn is provided on the support substrate, commonly to the optical waveguide. Thereby, the optical beam emitted from the optical waveguide hits the optical path conversion means with reliability, and the optical beam thus entered to the optical path conversion means hits the photodetection area of the photoreception device also with reliability, even when there may be some diversion in the optical beam emitted from the edge surface of the optical waveguide. Thereby, a high optical coupling is guaranteed between the optical waveguide and the photoreception device. As the optical waveguide and the photoreception device are formed of separate members, the present invention achieves the desired high optical coupling by merely mounting the photoreception device on the support substrate that already carries the optical waveguide as an integral body. Thereby, the alignment between the photoreception device and the optical waveguide can be achieved simply by using a marker, and complex adjustment process that typically includes the step of seeking for the maximum in the output of the photoreception device, can be eliminated.

Another object of the present invention is to provide a method for fabricating a photodetection module, comprising the steps of:

forming a layered body on a substrate such that said layered body includes an active layer;

forming a plurality of photoreception regions on said layered body;

forming a V-shaped groove on said layered body by an etching process, such that said V-shaped groove separates one photoreception region from another photoreception region;

dividing said layered body along said groove to form a plurality of photoreception elements, such that each of said photoreception elements has an oblique surface in correspondence to said V-shaped groove; and disposing said photoreception device upon a support substrate carrying thereon an optical waveguide, such that said oblique surface faces an edge surface of said optical waveguide.

According to the present invention, each of the photoreception device has an oblique edge surface corresponding to the V-shaped groove, and the oblique edge surface acts as a prism surface or mirror surface that changes the path of the optical beam emitted from the optical waveguide and entered the photoreception device, such that the optical beam hits the photodiode formed in the photoreception device. As the oblique surface is formed integrally to the photoreception device as a part thereof, it is not necessary to adjust the position of the oblique surface and the photodiode in the photoreception device. Further, as the photoreception device is mounted directly upon the support substrate carrying the optical waveguide, the adjustment between the photoreception device and the optical waveguide is substantially facilitated.

Another object of the present invention is to provide a method for fabricating a semiconductor optical detection device, comprising the steps of:

depositing a resist pattern on a substrate that carries thereon an active layer, such that a photoreception region of said active layer is exposed;

depositing a conductor layer on said resist pattern such that said conductor layer covers said exposed photoreception region;

depositing an electrode layer on said conductor layer by an electroplating process while using said conductor layer as an electrode; and forming an electrode lead by removing said resist pattern underneath said electrode layer.

According to the present invention, it is possible to form a lead electrode such that the lead electrode extends parallel to the layered body forming the photoreception device with a separation therefrom, by carrying out an electroplating process on the resist pattern, followed by removal of the resist pattern. The photoreception device having such a lead electrode can be mounted on a support substrate in such a state that the photoreception device engages with the support substrate at a side wall thereof and such that a principal surface of the photoreception device extends perpendicularly to the support substrate. The foregoing lead electrode may be bent and connected to a conductor pattern formed on the support substrate. In such a case, the optical beam emitted from an edge surface of an optical waveguide provided on the support substrate impinges upon the photoreception device generally in the direction perpendicular to the foregoing principal surface and experiences deflection toward a photodiode formed in the photoreception device by a prism surface formed on a part of the principal surface of the photoreception device. Thereby, the optical path length of the optical beam emitted from the optical waveguide and reaching the photodiode is reduced substantially, and the problem of spreading of the optical beam at the photodiode is minimized.

Other objects and further features of the present invention will become apparent from the following detailed description when read in conjunction with the attached drawings.

BRIEF DESCRIPTION OF THE DRAWINGS

FIGS. 16A–16H are diagrams showing the fabrication process of the optical module of FIG. 15;

DETAILED DESCRIPTION OF THE PREFERRED EMBODIMENTS

Figure 5:
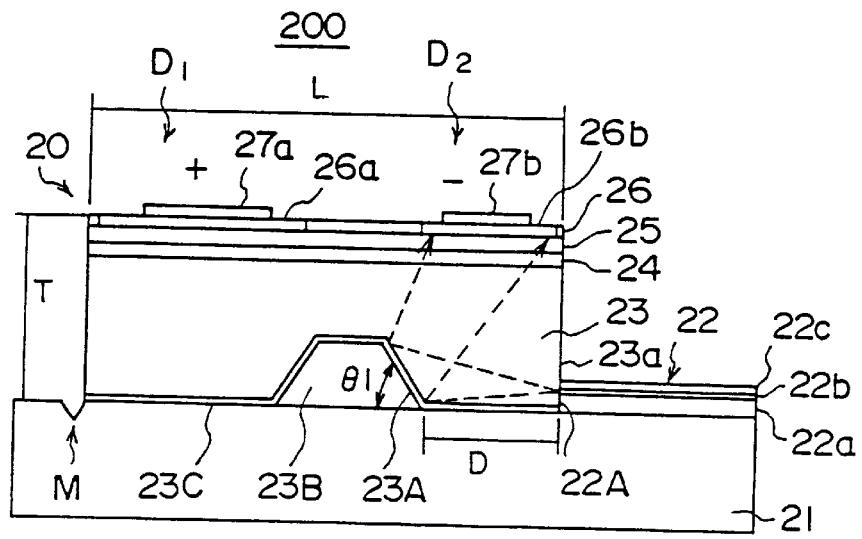
FIG. 5 is a diagram showing the construction of an optical module according to a first embodiment of the present invention.

FIG. 5 shows the construction of an optical module 200 according to a first embodiment of the present invention.

Referring to FIG. 5, the optical module 200 is formed on a support substrate 21 of Si, and includes an optical waveguide 22 formed on the substrate 21 and a photoreception device 20 formed also on the substrate 21 such that a side wall of the photoreception device 20 faces an edge surface 22A of the optical waveguide 22. The optical waveguide 22 is formed of glass or semiconductor layers deposited on the Si substrate 21 by a CVD process and includes a lower cladding layer 22a, a core layer 22b formed thereon, and an upper cladding layer 22c formed further on the core layer 22b. The optical waveguide 22 may be coupled optically to another optical waveguide (not shown) or a light emitting device on the support substrate 21 (not shown), wherein the optical waveguide 22 guides the optical beam injected thereto and emits the same at the foregoing edge surface 22A.

Figure 1:
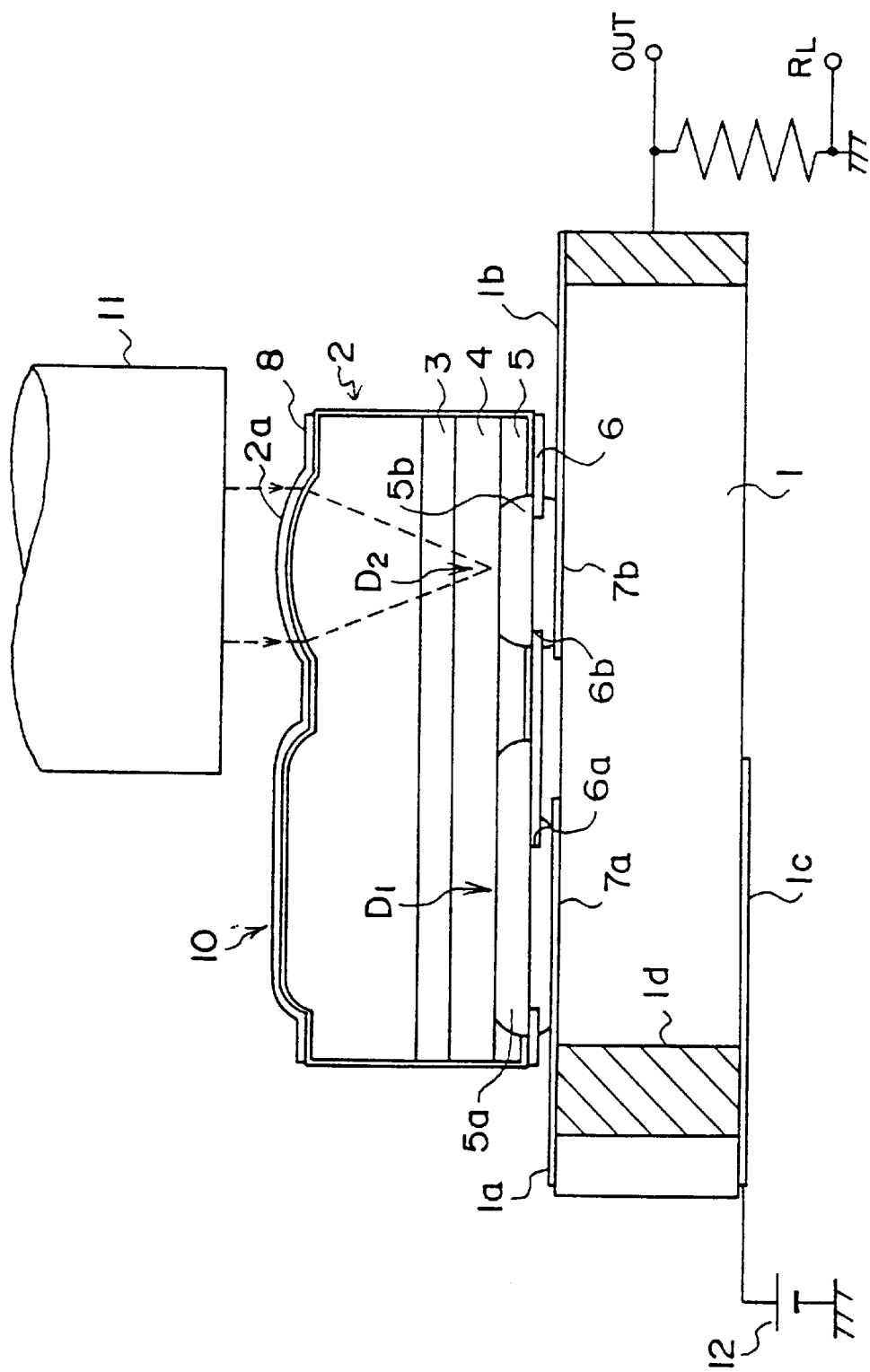
FIG. 1 is a diagram showing the construction of a conventional optical module.
Figure 2:
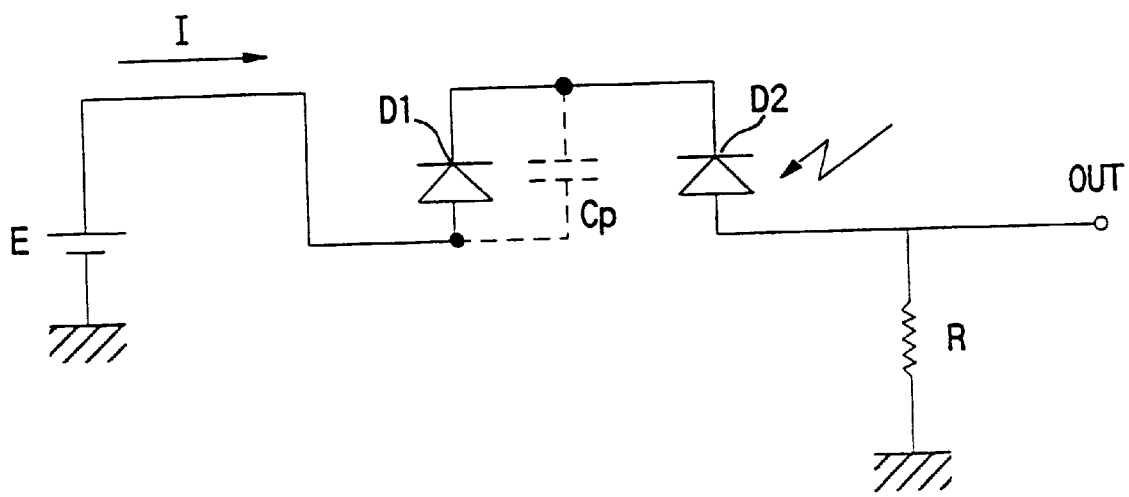
FIG. 2 is a circuit diagram showing the equivalent circuit diagram of the optical module of FIG. 1.

The photoreception device 20, on the other hand, is formed on a device substrate 23 of n-type InP and includes a buffer layer 24 of n-type InP corresponding to the layer 3 of FIG. 1, an absorption layer 25 of undoped InGaAs formed on the layer 24 in correspondence to the layer 4 of FIG. 1, and an active layer 26 of n⁻-type InP corresponding to the layer 5 of FIG. 1, wherein the layer 26 includes a p-type region 26a having a first area and another p-type region 26b having a second, smaller area, respectively in correspondence to the drive diode D1 and the photodiode D2 of FIG. 2. Further, electrode 27a and 27b are provided respectively on the regions 26a and 26b.

It should be noted that the device substrate 23 is defined by a side wall 23a and is provided on the support substrate 21 such that the side wall 23a faces the edge surface 22A of the foregoing optical waveguide 22. Further, the side wall 23a carries an anti-reflection film (not shown) thereon, and the side wall 23a and the edge surface 22A of the optical waveguide are engaged with each other across such an anti-reflection film.

In the optical module 200 of FIG. 5, the device substrate 23 further includes a depression defined by an oblique surface 23A on the lower major surface of the device substrate 23. Thus, there is formed a cavity or space 23B between the support substrate 21 and the device substrate 23 in correspondence to the depression, wherein the oblique surface 23A defining the depression forms an angle of $\theta_1$ with respect to the principal surface of the support substrate 21. Thereby, the oblique surface acts as a mirror surface that reflects the optical beam incident thereto from the edge surface 22A of the optical waveguide 22 toward the p-type region 23b.

In order that the optical beam reflected by the mirror surface 23A correctly hits the p-type region 26b, the total thickness T of the layered semiconductor body including the layers 23–26 is adjusted with respect to the angle $\theta_1$. When the oblique surface 23A is formed by a wet etching process of the device substrate 23, it should be noted that the (111) surface of InP appears as a result of the wet etching process. In this case, the angle $\theta_1$ theoretically takes a value of 54.7°, which is pertinent to the (111) surface of InP. Generally, the angle $\theta_1$ changes somewhat depending upon the type of the etchant or the mask pattern used in the etching process. By using an aqueous solution of HCl, Br or HBr, one can expose the foregoing (111) surface at the mirror surface 23A, and the angle $\theta_1$ takes a value of about 55°. In such a wet etching process, it is also possible to use a solution of HCl and $H_3PO_4$ or ethanol that contains Br, for the etchant.

On the lower major surface of the device substrate 23, a flux layer 23C is provided so as to include the oblique surface 23A, wherein the flux layer 23C typically includes layers of Ti, Au, Sn and Au respectively with thicknesses of 0.1 $\mu$m, 0.1 $\mu$m, 2 $\mu$m and 0.1 $\mu$m. By causing a fusion in the flux layer 23C in the state that the device substrate 23 is disposed on the support substrate 21, the photoreception device 20 is firmly bonded upon the support substrate 21. Thereby, the flux layer 23C covering the mirror surface 23A acts as a reflective coating that reflects the optical beam incident to the device substrate 23 from the edge surface 22A of the optical waveguide 22.

In the illustrated example, the optical beam emitted from the edge surface 22A of the optical waveguide 22 is reflected back in the upward direction by the mirror surface 23A. Thus, in correspondence to the path of the reflected optical beam, the diffusion region 26b forming the photodiode D2 is formed close to the side wall 23a with respect to the diffusion region 26a that forms the photodiode D1.

In the optical module 200 of FIG. 5 where the photoreception device 20 is mounted upon the support substrate 21 that carries thereon the optical waveguide 22 such that the lower major surface of the photoreception device 20 engages with the upper major surface of the support substrate 21 and such that the side wall 23a of the device substrate 23 engages with the edge surface 22A of the optical waveguide 22, with the anti-reflection film intervening therebetween, it is possible to achieve the desired high efficiently optical coupling between the photoreception device 20 and the optical waveguide 22 easily by a simple mounting process of the photoreception device 20 on the support substrate 21. The alignment between the photoreception device and the optical waveguide is achieved easily by using a positioning mark M as shown in FIG. 5.

In the construction of FIG. 5, it should be noted further that the optical beam emitted from the edge surface 22A of the optical waveguide 22 hits the diffusion region 26b forming the photodiode D2 of FIG. 2 as well as associated depletion region, from the lower direction. Thereby, the entire optical beam spot falls upon the diffusion region 26b, and the problem such as the optical beam partly misses the diffusion region 26b does not occur. In other words, the optical module of FIG. 5 has an advantageous feature of reduced optical loss.

In the structure of FIG. 5, it should be noted that the support substrate 21 is by no means limited to Si, but any other suitable semiconductor material such as InP or even a glass may be used for the support substrate 21.

Figure 6:
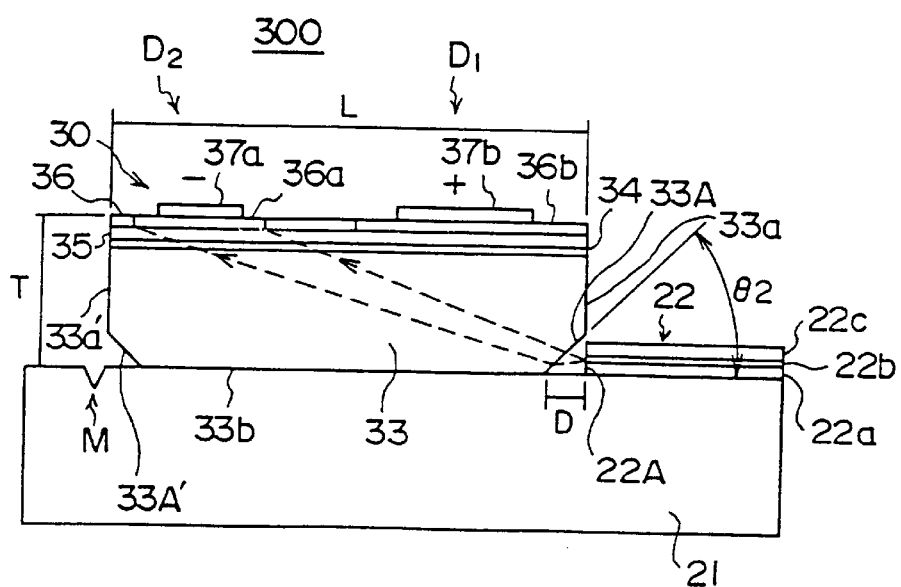
FIG. 6 is a diagram showing the construction of an optical module according to a second embodiment of the present invention.

FIG. 6 shows the construction of an optical module 300 according to a second embodiment of the present invention.

Referring to FIG. 6, the optical module 300 includes the support substrate 21 carrying thereon the optical waveguide 22 similarly to the embodiment of FIG. 5, wherein the support substrate 21 now carries a photoreception device 30 that includes a device substrate 33 of n-type InP. It will be noted that the device substrate 33 is defined by a side wall 33a and includes an oblique surface 33A formed along the edge where the foregoing side wall 33a meets with a lower major surface 33b of the substrate 33, wherein the oblique surface 33A forms an angle of $\theta_2$ with respect to the lower major surface 33b of the device substrate 33.

Similarly as before, the device substrate 33 carries, on the upper major surface thereof, a buffer layer 34 of n-type InP corresponding to the InP layer 3 or 24, and an optical absorption layer 35 of undoped InGaAs is provided on the buffer layer 34 in correspondence to the optical absorption layer 4 or 25 described previously. Further, an active layer 36 of n⁻-type InP is provided on the layer 35 in correspondence to the layer 5 or 26 described already, wherein the layer 36 includes a p-type region 35a corresponding to the photodiode D2 and a p-type region 36b corresponding to the drive diode D2.

In the illustrated example, the lower major surface of the device substrate 33 is jointed upon the upper major surface of the support substrate 21 similarly to the first embodiment, and the device substrate 33 is disposed such that the side wall 33a faces the edge surface 22A of the optical waveguide 22 and such that the optical beam emitted from the edge surface 22A of the optical waveguide 22 impinges upon the oblique surface 33A of the device substrate 33.

In FIG. 6, it is illustrated that the edge surface 22A of the optical waveguide 22 and the side wall 33a of the device substrate 33 are aligned on a common plane, while the present embodiment is not limited to such an embodiment, and one may provide the device substrate 33 such that the edge surface 22A of the optical waveguide 22 is located at a position beyond the side wall 33a where the oblique surface 33A forms an overhang. In such a construction, too, one can easily determine the positional relationship between the device substrate 33 and the optical waveguide 22 by using the positioning mark M formed on the support substrate 21.

In the optical module 300 of FIG. 6, it should be noted that the foregoing oblique surface 33A carries an anti-reflection film (not illustrated), and the optical beam emitted from the edge surface 22A of the optical waveguide 22 is reflected in the upward direction toward the upper major surface of the device substrate 33 at the foregoing oblique surface 33A. Thereby, the optical beam thus refracted impinges upon the diffusion region 36a that forms the photodiode D2.

In order to receive the optical beam thus refracted by the oblique surface 33A now acting as a prism surface, the photoreception device 30 of FIG. 6 includes the diffusion region 36a forming the photodiode D2 at the side away from the side wall 33a with respect to the diffusion region 36b forming the drive diode D1.

In such a construction, too, the optical beam emitted from the edge surface 22A of the optical waveguide 22 hits the diffusion region 36a from the lower direction, and the problem of optical loss caused by the optical beam missing the diffusion region 36a becomes minimum.

Similarly as before, the angle $\theta_2$ of the oblique surface 33A with respect to the lower major surface 33b of the device substrate 33 falls in a range between 45°–60°. Particularly, the angle $\theta_2$ takes a value of 54.7° when the oblique surface 33A is formed by the (111) surface of InP.

Figure 7:
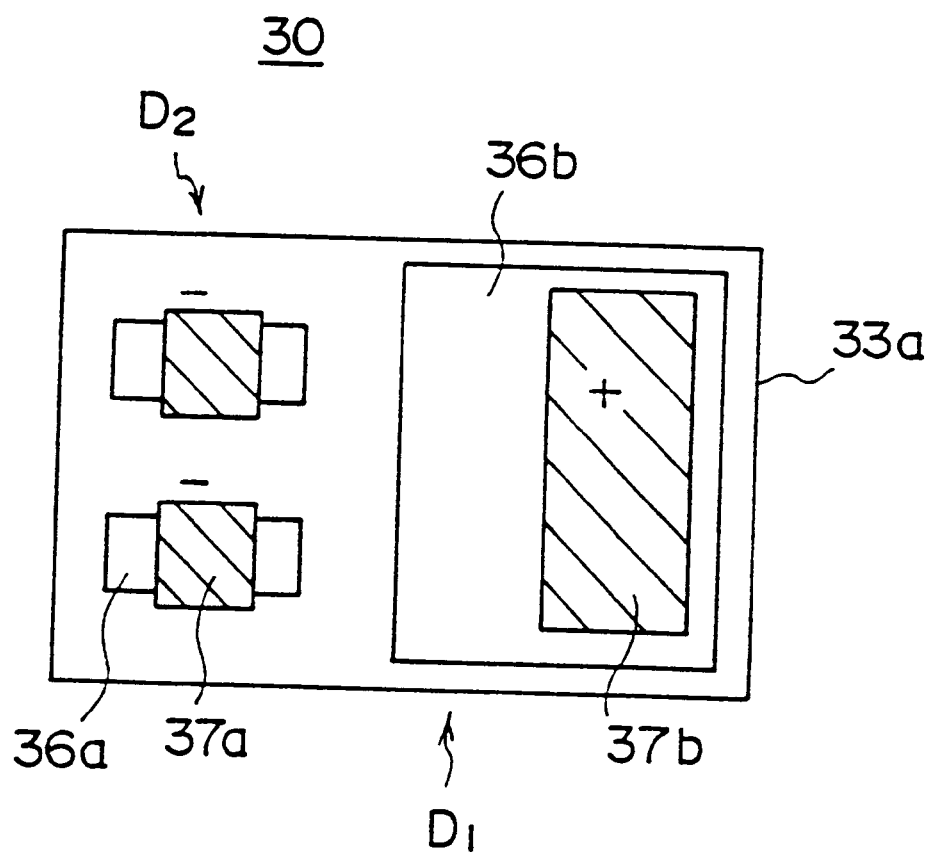
FIG. 7 is a diagram showing the optical module of FIG. 6 in a plan view.

FIG. 7 shows the photoreception device 30 of the optical module 300 shown in FIG. 6 in a plan view.

Figure 3:
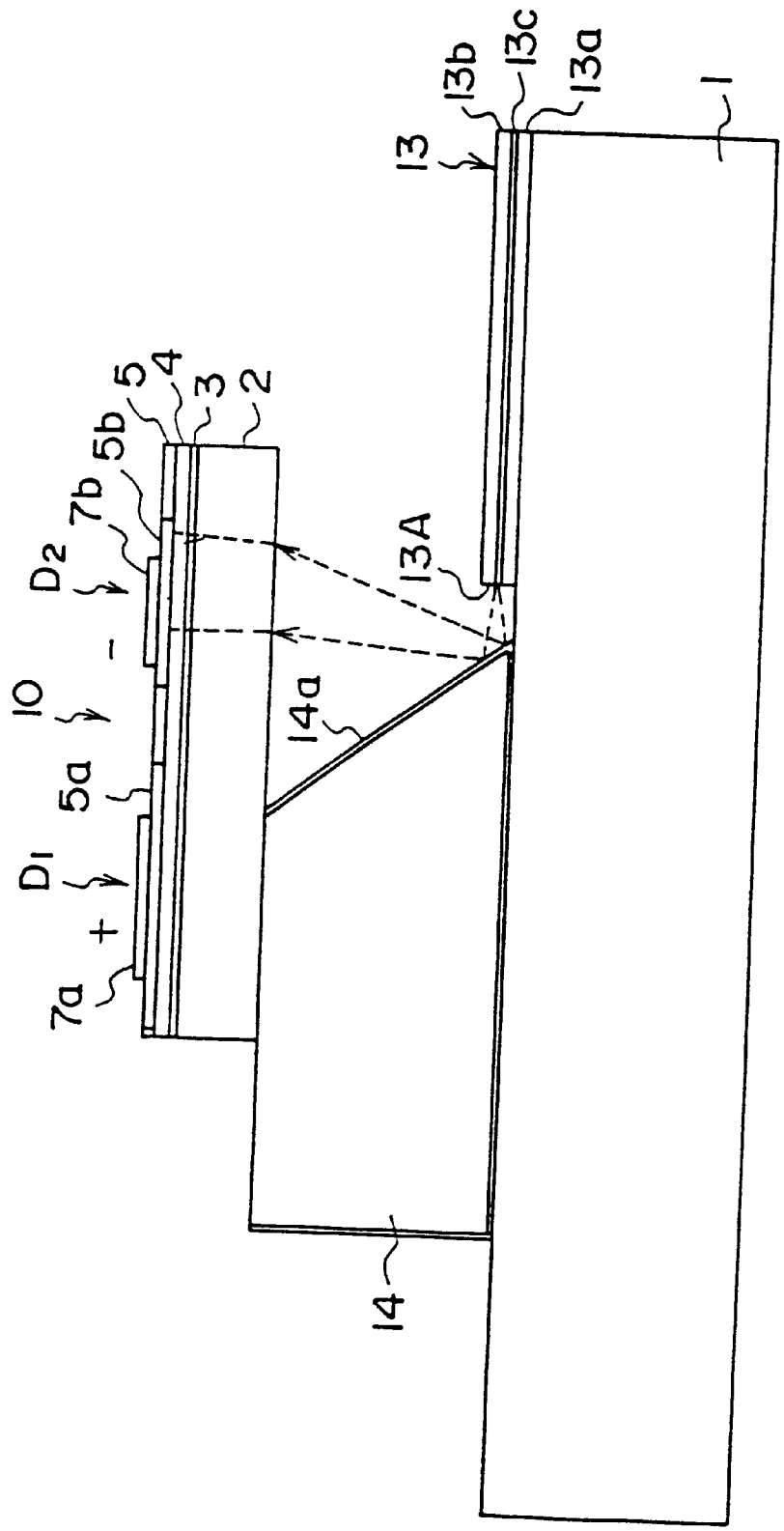
FIG. 3 is a diagram showing the construction of another conventional optical module.
Figure 4:
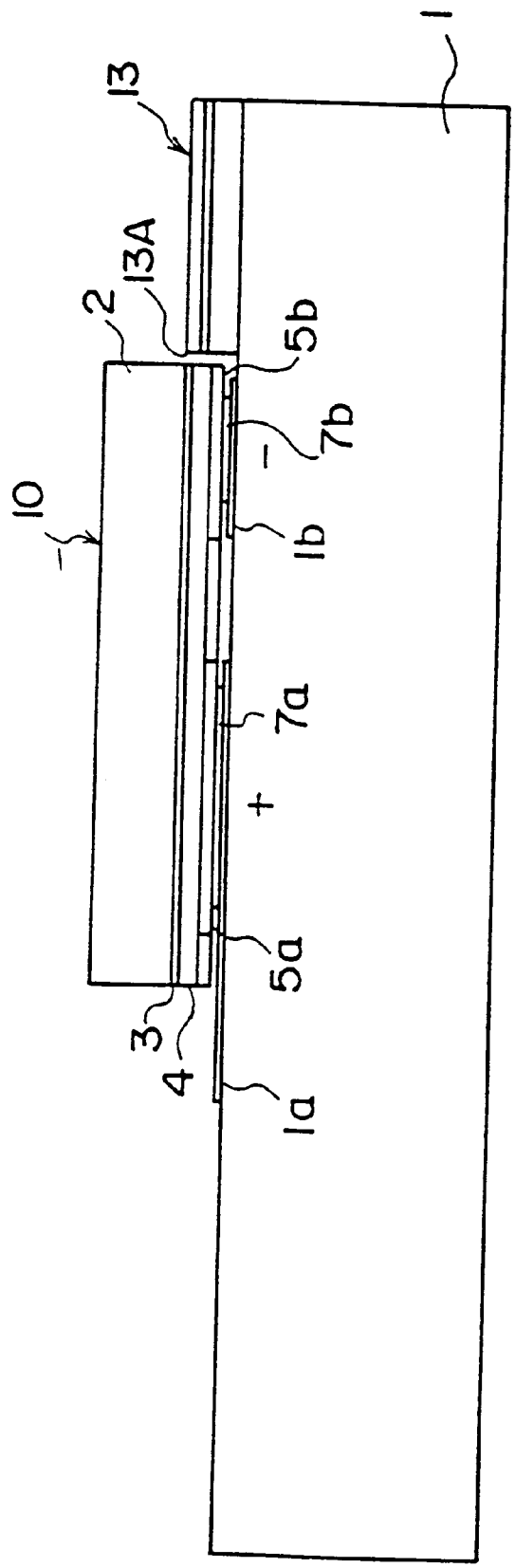
FIG. 4 is a diagram showing the construction of still another conventional optical module.

Referring to FIG. 7, it will be noted that the diffusion region 36a forming the photodiode D2 has an area substantially smaller than the diffusion region 36b forming the drive diode D1. Associated with the reduced area for the diffusion region 36a that forms the essential part of the photodiode D2, the photodiode D2 shows a very high speed response. Further, it should be noted that the optical beam, emitted from the edge surface 22A of the optical waveguide 22, reaches the photodiode D2 after traveling through the device substrate 33 with a reduced optical path distance as compared with the case of using a separate mirror element as in the conventional construction of FIG. 3. Thereby, the optical beam divergence is held minimum, and one can reduce the size of the diffusion region 36a accordingly. The same argument as above applies also to the first embodiment described with reference to FIG. 5. Typically, the diffusion region 26b or 36a may be formed to have an area smaller than one-tenth the area of the diffusion region 26a or 36b.

In the optical module 200 of FIG. 6, it will be noted that the device substrate 33 has another oblique surface 33A' also along an edge where the lower major surface 33b of the device substrate 33 meets with another side wall 33a' that opposes the side wall 33a. The photoreception device 30 having such a structure has an additional advantageous feature in that it can be fabricated easily by forming a plurality of V-shaped grooves $G_1$–$G_4$ on a substrate or wafer carrying the layers 34–36 formed on the device substrate 33, in correspondence to the foregoing oblique surfaces 33A and 33A' as indicated in FIG. 8, followed by cleaving the device substrate 33 at each of the grooves $G_1$–$G_4$.

Figure 8:
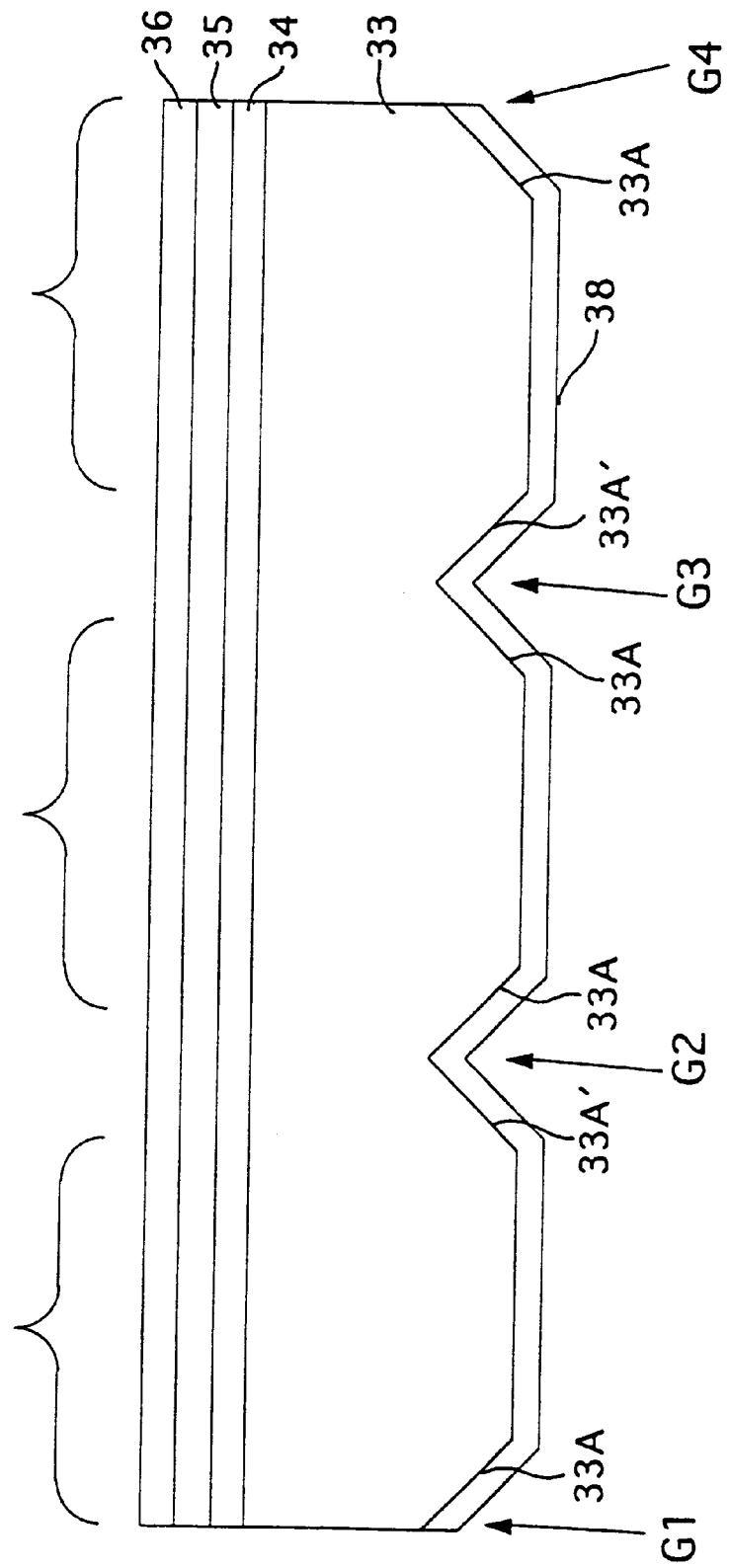
FIG. 8 is a diagram showing a fabrication step of the optical module of FIG. 6.

Referring to FIG. 8, it will be noted that the illustrated layered semiconductor body includes device regions DEVICE 1, DEVICE 2 and DEVICE 3 each in turn including the p-type diffusion regions 36a and 36b in the n⁻-type InP layer 36. Further, an anti-reflection film 38 is formed on the lower major surface of the device substrate 33 including the grooves $G_1$–$G_4$, wherein each of the photoreception device 30 is mounted upon the support substrate 21 by a flux layer at the lower major surface of the device substrate 33 as indicated in FIG. 6.

In any of the embodiments of FIGS. 5 and 6, it should be noted that proper injection of the optical beam, emitted from the edge surface 22A of the optical waveguide 22, into the diffusion region 26b or 36a that forms the photodiode D2, depends primarily upon a proper location of incidence of the optical beam into the oblique surface 22A or 33A and hence the relative height of the waveguide layer 22b with respect to the semiconductor layers 25 and 26. On the other hand, the effect of the distance D (FIG. 6) between the waveguide edge surface 22A and the device substrate 23 does not influence significantly upon such an optical coupling between the optical waveguide 22 and the photodiode D2.

With this respect, the construction of FIG. 5 or FIG. 6 is particularly advantageous, as the device substrate 33 is mounted directly upon the support substrate 21, and because of the fact that the thickness of the semiconductor layers 34–36 as well as the layers 22a–22c forming the optical waveguide 22 can be controlled with high precision. Because it is not necessary to adjust the distance D with high precision, the coarse adjustment using the marker M is sufficient for achieving the desired optical coupling.

Next, an optical module 400 according to a third embodiment of the present invention will be described with reference to FIG. 9, wherein those parts described previously are designated by the same reference numerals and the description thereof will be omitted.

Figure 9:
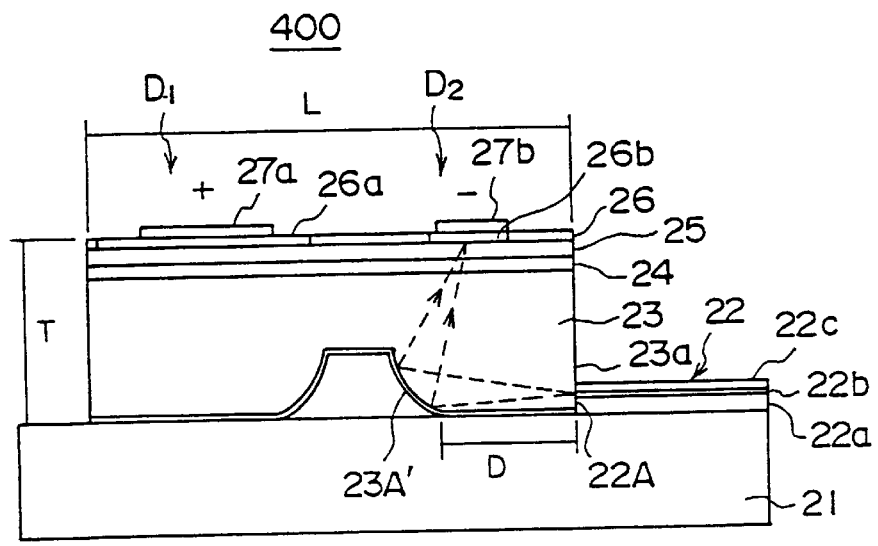
FIG. 9 is a diagram showing the construction of an optical module according to a third embodiment of the present invention.

Referring to FIG. 9, the optical module 400 has a construction substantially identical with the module 200 of FIG. 5, except that the optical module 400 includes a curved mirror surface 23A' in place of the flat mirror surface 23A of FIG. 5. As a result of use of the curved mirror surface 23A', it is possible to focus the reflected optical beam upon the diffusion region 26b forming the photodiode D2. Thereby, one can reduce the area of the diffusion region 26b and hence the junction capacitance of the photodiode D2 further, and the response of the photodiode D2 is improved.

It should be noted such a curved mirror surface 23A' can be formed by a process described in the U.S. Pat. No. 5,309,468, which is incorporated as a reference. Briefly, the process employs a thermally induced reflowing of a resist pattern that causes a blunting in the edge of the resist pattern, followed by a dry etching process while using such a blunted resist pattern as an etching mask.

As other aspects of the present embodiment are identical to those of FIG. 5, further description of the present embodiment will be omitted.

Figure 10:
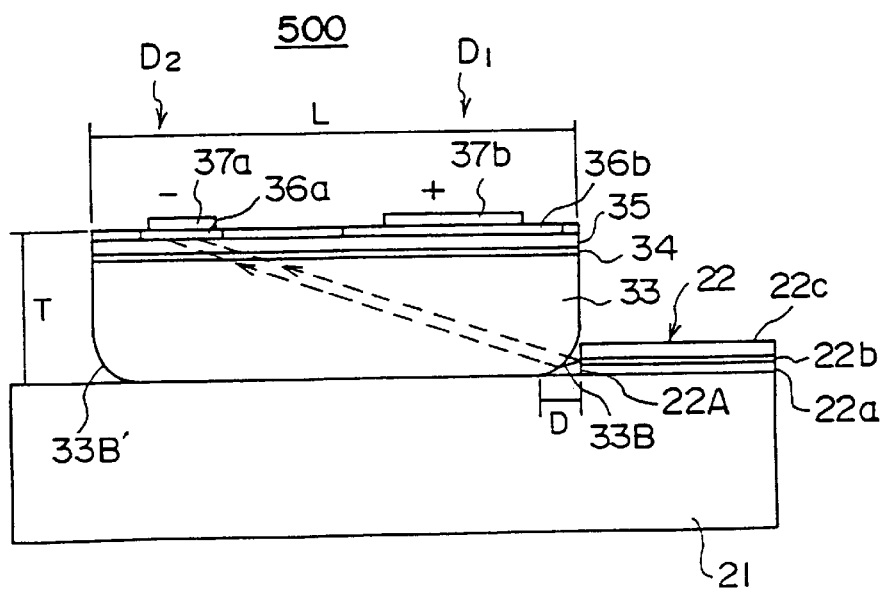
FIG. 10 is a diagram showing the construction of an optical module according to a fourth embodiment of the present invention.

FIG. 10 shows the construction of an optical module 500 according to a fourth embodiment of the present invention, wherein those parts described previously are designated by the same reference numerals and the description thereof will be omitted.

Referring to FIG. 10, the optical module 500 has a construction substantially identical with the module 300 of FIG. 6, except that the optical module 500 includes a curved prism surfaces 33B and 33B' in place of the flat prism surfaces 33A and 33A' of FIG. 6. As a result of use of the curved prism surfaces 33B and 33B', it is possible to focus the refracted optical beam upon the diffusion region 36a forming the photodiode D2. Thereby, one can reduce the area of the diffusion region 36a and hence the junction capacitance of the photodiode D2 further, and the response of the photodiode D2 is improved.

It should be noted such a curved prism surfaces 33B and 33B' can be formed by a process described in the U.S. Pat. No. 5,309,468 similarly to the case of the curved mirror surfaces 23A'.

As other aspects of the present embodiment are identical to those of FIG. 6, further description will be omitted.

Figure 11:
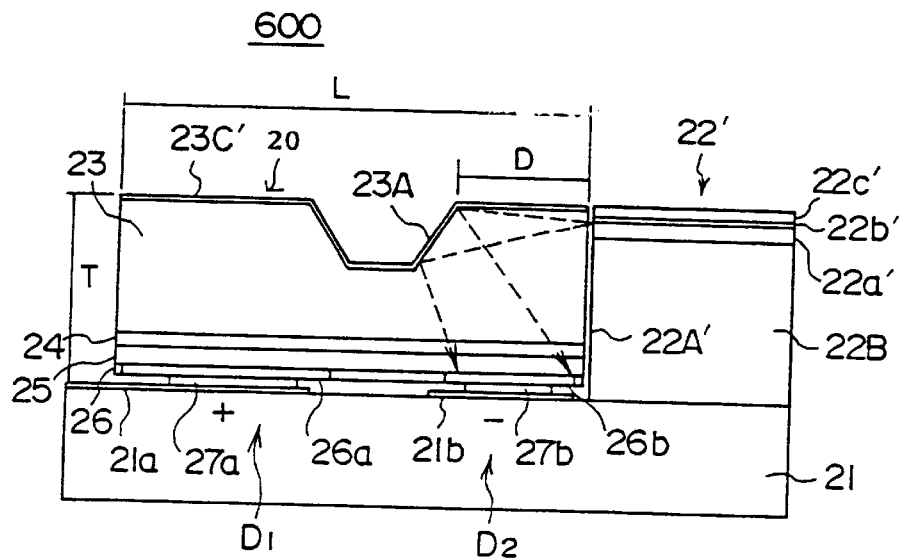
FIG. 11 is a diagram showing the construction of an optical module according to a fifth embodiment of the present invention.

FIG. 11 shows the construction of an optical module 600 according to a fifth embodiment of the present invention, wherein those parts corresponding to the parts described previously are designated by the same reference numerals and the description thereof will be omitted.

In the construction of FIG. 11, it will be noted that the photoreception device 20 of FIG. 6 is mounted upon the support substrate 21 in a turned over state by a flip-chip process, such that the electrodes 27a and 27b are connected to the wiring patterns 21a and 21b formed on the support substrate 21. For this purpose, the photoreception device 20 carries solder bumps in correspondence to the electrodes 27a and 27b.

In the construction of FIG. 11, it will be noted that the mirror surface 23A is now formed at the top side of the device substrate 23. Thus, the optical module 600 of FIG. 11 provides a thick spacer layer 22B of polyimide on the support substrate 21 and forms an optical waveguide 22' thereon such that the optical beam emitted from an edge surface 22A' of the optical waveguide 22' hits the mirror surface 23A properly. It should be noted that the optical waveguide 22' includes a lower cladding layer 22a' formed directly on the spacer layer 22B, an optical waveguide layer 22b' formed on the cladding layer 22a' and an upper cladding layer 22c' formed further on the optical waveguide layer 22b'. The optical beam thus reflected by the mirror surface 23A hits the diffusion region 26b of the photodiode D2. In order to facilitate the reflection of the optical beam, a reflective film 23C' is formed on the upper major surface of the device substrate 23 so as to cover the mirror surface 23A.

As the photoreception device 20 is mounted upon the support substrate 21 by a flip-chip process in the optical module 600 of FIG. 11, it is no longer necessary to provide wire bonding process upon the electrodes 27a and 27b of the photoreception device 20. Thereby, the risk that the diffusion region 26b forming the essential part of the photodiode D2 being damaged by a mechanical stress associated with the wire bonding process, is substantially reduced. Further, the use of the flip-chip process improves the throughput of production.

Figure 12:
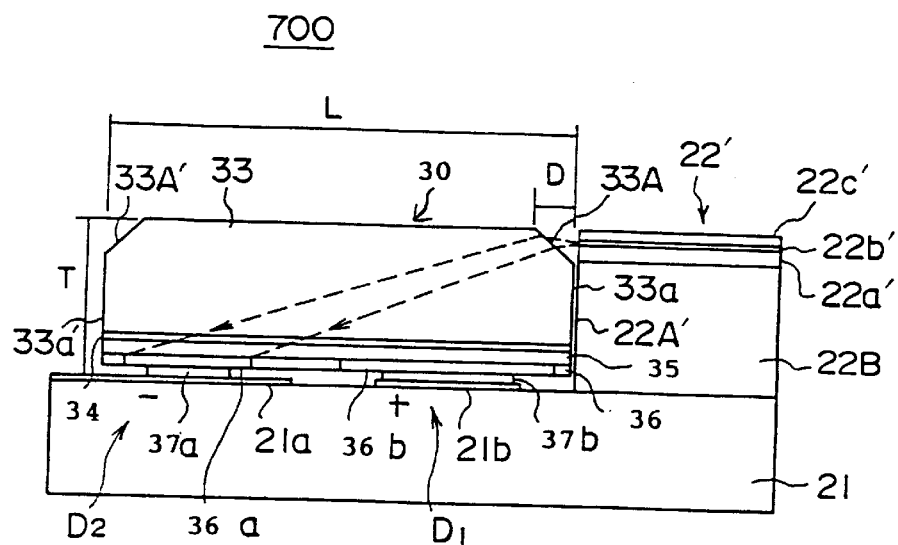
FIG. 12 is a diagram showing the construction of an optical module according to a sixth embodiment of the present invention.

FIG. 12 shows the construction of an optical module 700 according to a sixth embodiment of the present invention, wherein those parts described previously are designated by the same reference numerals and the description thereof will be omitted.

In the construction of FIG. 12, the photoreception device 30 of FIG. 6 is mounted upon the support substrate 21 in a turned over state by a flip-chip process, such that the electrodes 37a and 37b cause electrical as well as mechanical engagement with the wiring patterns 21a and 21b formed on the support substrate 21. Further, the optical waveguide 22' is provided on the support substrate in the state that the spacer layer 22B is intervening between the support substrate 21 and the optical waveguide 22'. Thus, the optical beam emitting form the edge surface 22A' of the optical waveguide 22' experiences a refraction in the downward direction at the prism surface 33A now formed at the top side of the support substrate 33 and hits the diffusion region 36a now located at the bottom side of the device substrate 33 as indicated in FIG. 12.

In the construction of FIG. 12, too, it is possible to eliminate any mechanical stress from the photodiode D2 due to the flip-chip mounting process. Further, the throughput of fabrication of the optical module is improved.

Next, an optical module 800 according to a seventh embodiment of the present invention will be described with reference to FIG. 13.

Figure 13:
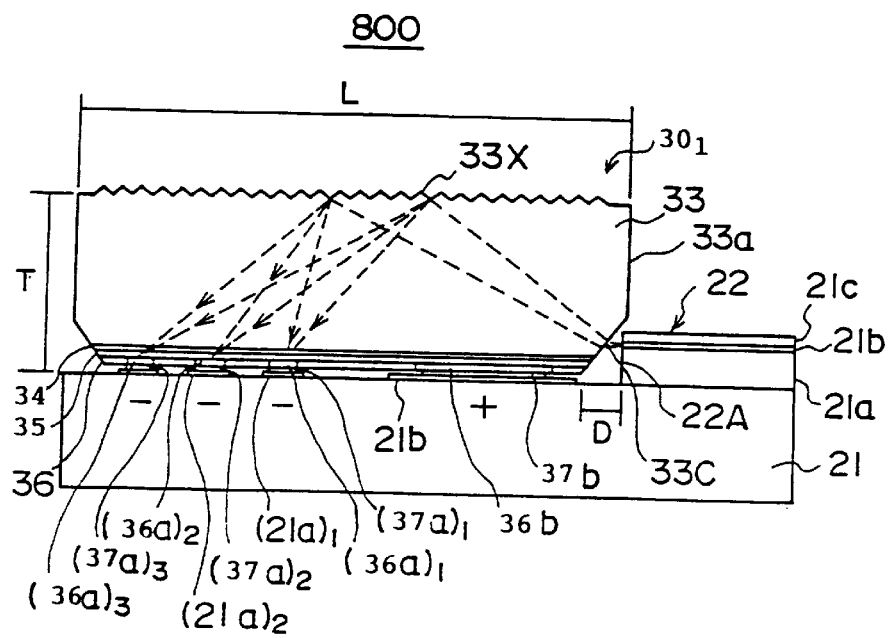
FIG. 13 is a diagram showing the construction of an optical module according to a seventh embodiment of the present invention.

Referring to FIG. 13, the optical module 800 includes a photoreception device $30_1$ having a construction similar to the photoreception device 30, wherein the photoreception device $30_1$ is flip-chip mounted upon the support substrate 21 similarly to the optical module 700 of FIG. 12. On the other hand, the photoreception device $30_1$ includes the semiconductor layers 34–36 on the bottom side of the device substrate 33. Further, the device substrate 33 includes an oblique surface 33C at the edge where the side wall 33a of the device substrate 33 and the surface of the semiconductor layer 36 meet with each other. Thus, the optical beam emitted from the edge surface 22A of the optical waveguide 22, formed on the support substrate 21, impinges straight upon the foregoing oblique surface 33C acting as a prism surface, and the optical beam experiences a refraction in the upward direction at the prism surface 33C.

It should be noted that the device substrate 33 includes a diffraction grating 33X formed on the top side thereof in the illustrated, turned-over state of the photoreception device $30_1$, such that the optical beam, refracted by the prism surface 33C, experiences a diffraction. As a result of the diffraction, the optical beam is decomposed into a number of optical beam elements each corresponding to an optical component included in the optical beam, in which the optical components are wavelength multiplexed.

The optical beam elements are thereby diffracted by the diffraction grating 33X with respective diffraction angles according to the wavelengths thereof and reach the bottom side of the device substrate 33 where the semiconductor layers 34–36 are formed.

In the optical module 800 of FIG. 13, the layer 36, formed of n⁻-type InP, includes a number of p-type diffusion regions $(36a)_1$, $(36a)_2$, $(36a)_3$, . . . , in correspondence to where the diffracted optical beam elements are expected to hit. Further, bump electrodes $(37a)_1$, $(37a)_2$, $(37a)_3$, . . . are provided in correspondence to the diffusion regions $(36a)_1$, $(36a)_2$, $(36a)_3$, . . . , wherein each of the diffusion regions $(36a)_1$, $(36a)_2$, $(36a)_3$, . . . forms a photodiode D2. The photoreception device $30_1$ is flip-chip mounted upon the support substrate 21 such that the bump electrodes $(37a)_1$, $(37a)_2$, $(37a)_3$, . . . achieve electrical as well as mechanical engagement with corresponding wiring patterns $(21a)_1$, $(21a)_2$, $(21a)_3$, . . . provided on the support substrate 21.

Thus, the optical module 800 of FIG. 13 not only achieves the desired, efficient optical coupling between the optical waveguide 22 and the photodiode D2 with low cost, but also acts as an optical demultiplexer for demultiplexing a wavelength-multiplex optical signal supplied from the optical waveguide 22.

Next, an optical module 900 according to an eighth embodiment of the present invention will be described with reference to FIG. 14, wherein those parts corresponding to the parts described previously are designated by the same reference numerals and the description thereof will be omitted.

Figure 14:
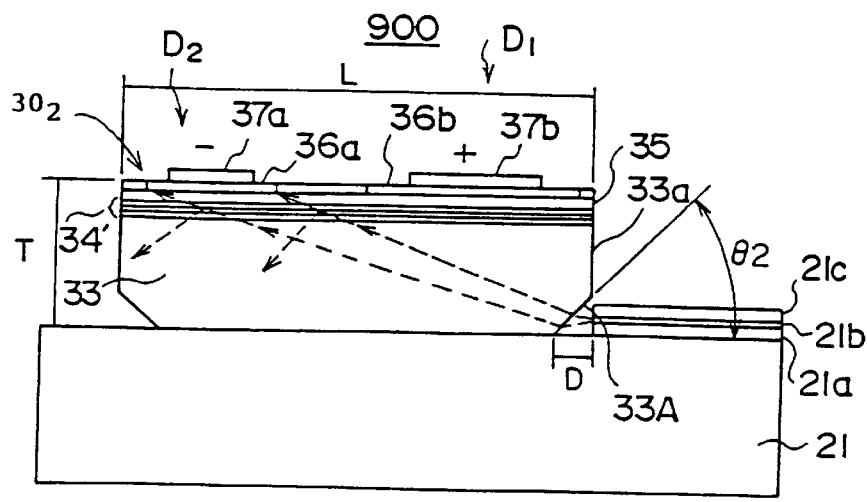
FIG. 14 is a diagram showing the construction of an optical module according to an eighth embodiment of the present invention.

Referring to FIG. 14, the optical module 900 is a modification of the optical module 300 of FIG. 6 and includes a photoreception device $30_2$ where the semiconductor layer 34 in the photoreception device 30 is now replaced by a multilayer filter 34'. The multilayer filter 34' includes an alternate stacking of an InGaAsP film and an InP film each having a quarter wavelength thickness of the incident optical beam, and passes the optical beam having a predetermined wavelength selectively to the photodiode D2 after the optical beam is refracted by the prism surface 33A. Thus, the optical module 900 operates as a wavelength-selective optical detector.

Next, an optical module 1000 according to a ninth embodiment of the present invention will be described with reference to FIG. 15, wherein those parts described previously are designated by the same reference numerals and the description thereof will be omitted.

Figure 15:
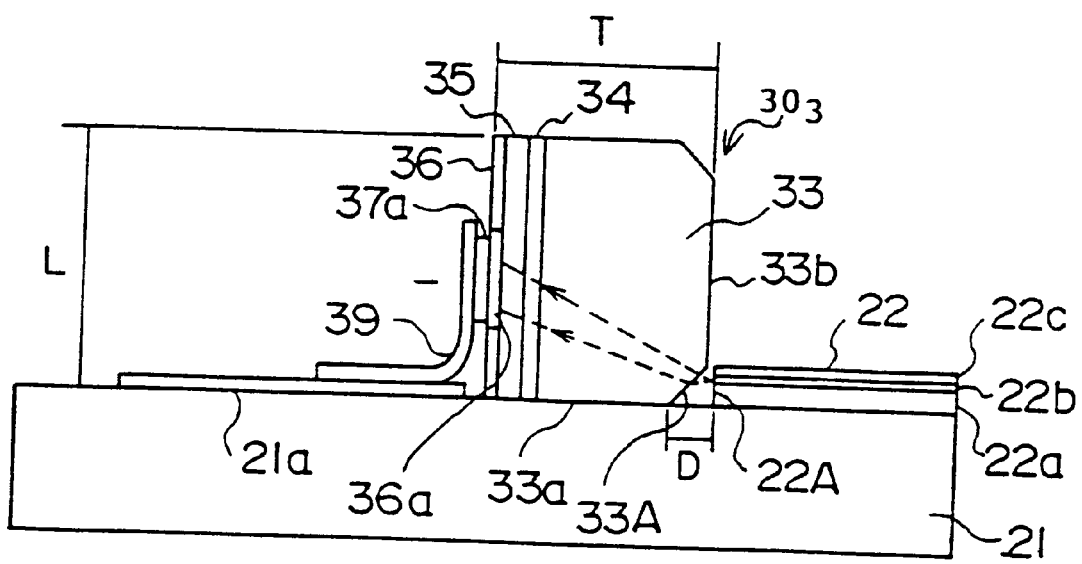
FIG. 15 is a diagram showing the construction of an optical module according to a ninth embodiment of the present invention.

Referring to FIG. 15, the optical module 1000 includes a photoreception device $30_3$ provided on the support substrate 21, in an upright state such that the side wall 33a now engages with the top surface of the support substrate 21. More specifically, the photoreception device $30_3$ is disposed on the device substrate 21 such that the principal surface 33b of the device substrate 33 faces the optical waveguide 22.

Thus, the optical beam emitted from the optical waveguide 22 hits the oblique surface 33A acting as a prism surface and is refracted in the upward direction, wherein the optical beam thus refracted reaches the p-type diffusion region 36a formed at the other side of the device substrate 33 and forming the photodiode D2.

The photoreception device $30_3$ of FIG. 15 further includes an L-shaped lead electrode 39 in connection to the electrode 37a corresponding to the diffusion region 36a, and the L-shaped lead electrode 39 is connected to the wiring pattern 21a formed on the support substrate 21. It should be noted that such a connection of the lead electrode 39 to the wiring pattern 21a is achieved easily by a surface mounting process.

In the optical module 1000 of FIG. 15, it should be noted that the optical beam emitted from the edge surface 22A of the optical waveguide 22 proceeds to the diffusion region 36a through the device substrate 33 with a minimum optical path length. Thereby, the divergence of the optical beam at the diffusion region 36a is held minimum.

When fabricating the optical module 1000 of FIG. 15, it is desired to form the lead electrode 39 on the photoreception device $30_3$ by a deposition of a conductor layer rather than conducting a wire bonding process, so as to eliminate stress from the diffusion region 36a.

Figure 16A:
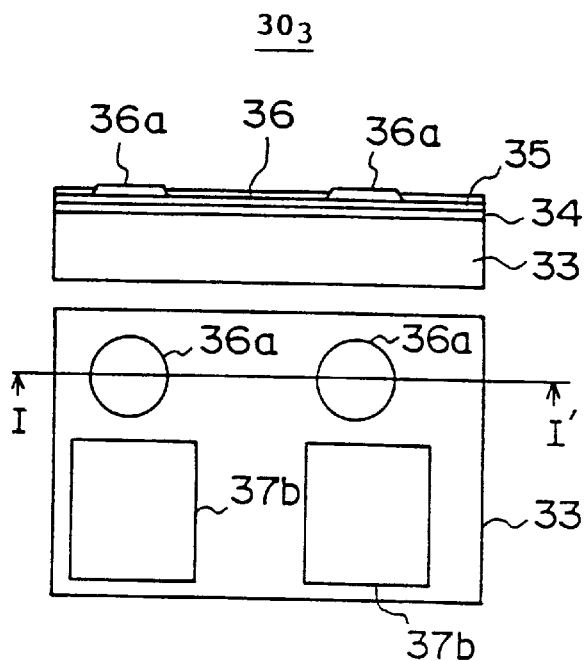
Figure 16B:
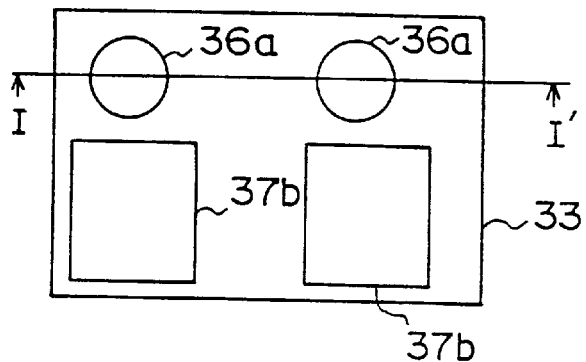
Figure 16C:
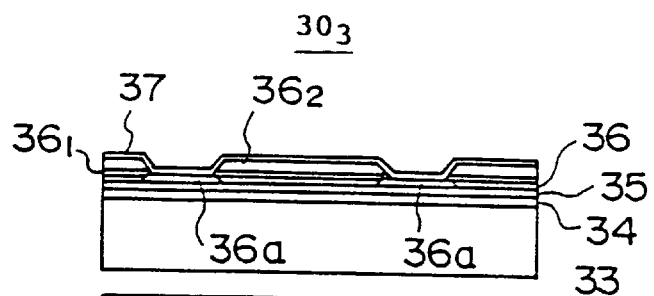
Figure 16D:
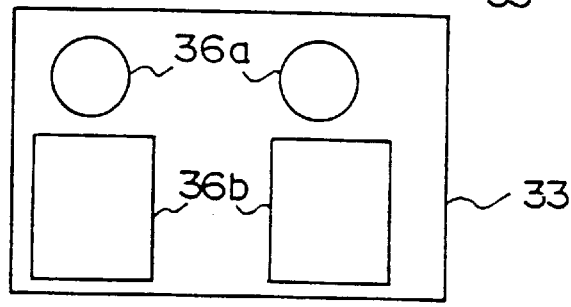

FIGS. 16A–16H show the process for forming the lead electrode 39, wherein FIG. 16B shows a plan view of the structure of FIG. 16A, FIG. 16D shows a plan view of the structure of FIG. 16C, FIG. 16F shows a plan view of the structure of FIG. 16E, and FIG. 16H shows a plan view of the structure of FIG. 16G.

FIGS. 16A and 16B show the photoreception device $30_3$ in the initial state in which the diffusion region 36a is formed in the layer 36 of n⁺-type InP, wherein FIG. 16A shows the cross section of the structure of FIG. 16B taken along a line I–I'.

Next, in the step of FIGS. 16C and 16D, a polyimide layer $36_1$ is deposited on the InP layer 36, followed by a patterning process using a resist mask $36_2$, to expose the diffusion region 36a. Further, an electrode layer 37 is deposited on the resist mask $36_2$ so as to cover the exposed surface of the diffusion region 36a, by depositing layers of Ti, Pt and Au consecutively. Thereby, the Au layer acts as a low resistance layer while the Ti and Pt layers act as a barrier metal layer.

Next, in the step of FIGS. 16E and 16F, a resist pattern 39a is formed so as to expose the region where the lead electrode 39 is to be formed, and the lead electrode 39 is formed on the exposed part of the electrode layer 37 by an electrode plating process of Au.

After the lead electrode 39 is formed as such, the electrode layer 37 outside the lead electrode 39 is removed by an ion milling process. Further, by removing the resist patterns 39a and $36_2$ by dissolving the resin of the resist patterns into a solvent, a structure shown in FIGS. 16G and 16H is obtained. In the structure of FIGS. 16G and 16H, it will be noted that lead electrode 39 extends along the surface of the semiconductor layer 36 but with a separation therefrom. Further, a scribe line 33Z is formed on the rear side of the device substrate 33 for facilitating the cleaving process used for dividing the structure into individual photoreception devices.

Figure 17A:
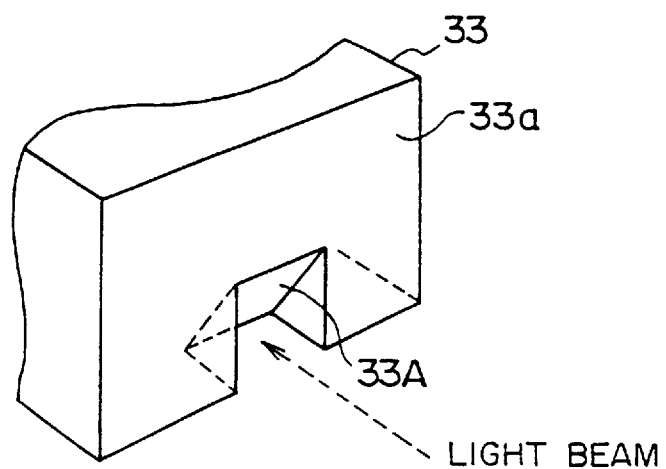
FIGS. 17A and 17B are diagrams showing various embodiments of a prism surface used in the optical module of the present invention.
Figure 17B:
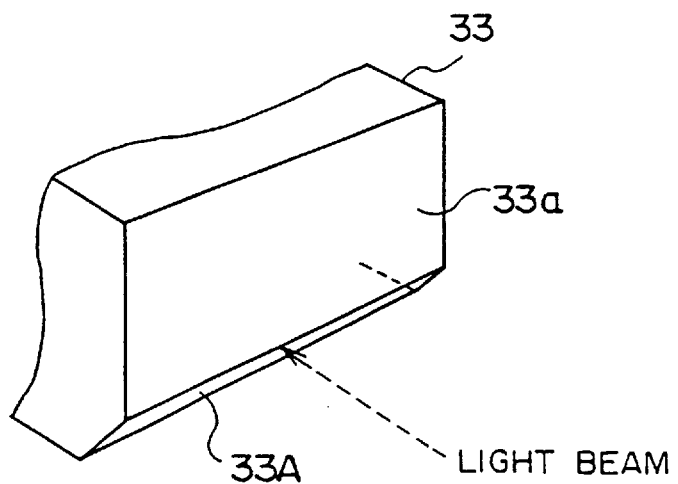

FIGS. 17A and 17B show a modification of the prism surface 33A formed on the device substrate 33.

In the example of FIG. 17A, it will be noted that the prism surface 33A is formed only on a part of the ridge where the side wall 33a meets the lower major surface of the support substrate 33, while the prism surface of FIG. 17B extends over the entire length of the foregoing ridge.

Any of the constructions of FIG. 17A and FIG. 17B may be employed for the photodiode with the same effect in terms of the function of the device, while the construction of FIG. 17A may be more preferable in view of the rigidity of the substrate when forming a large number of such photodiodes on a common substrate or wafer. In the construction of FIG. 17B, the mechanical strength of the wafer may be deteriorated due to the grooves formed on the wafer in large number.

Figure 18:
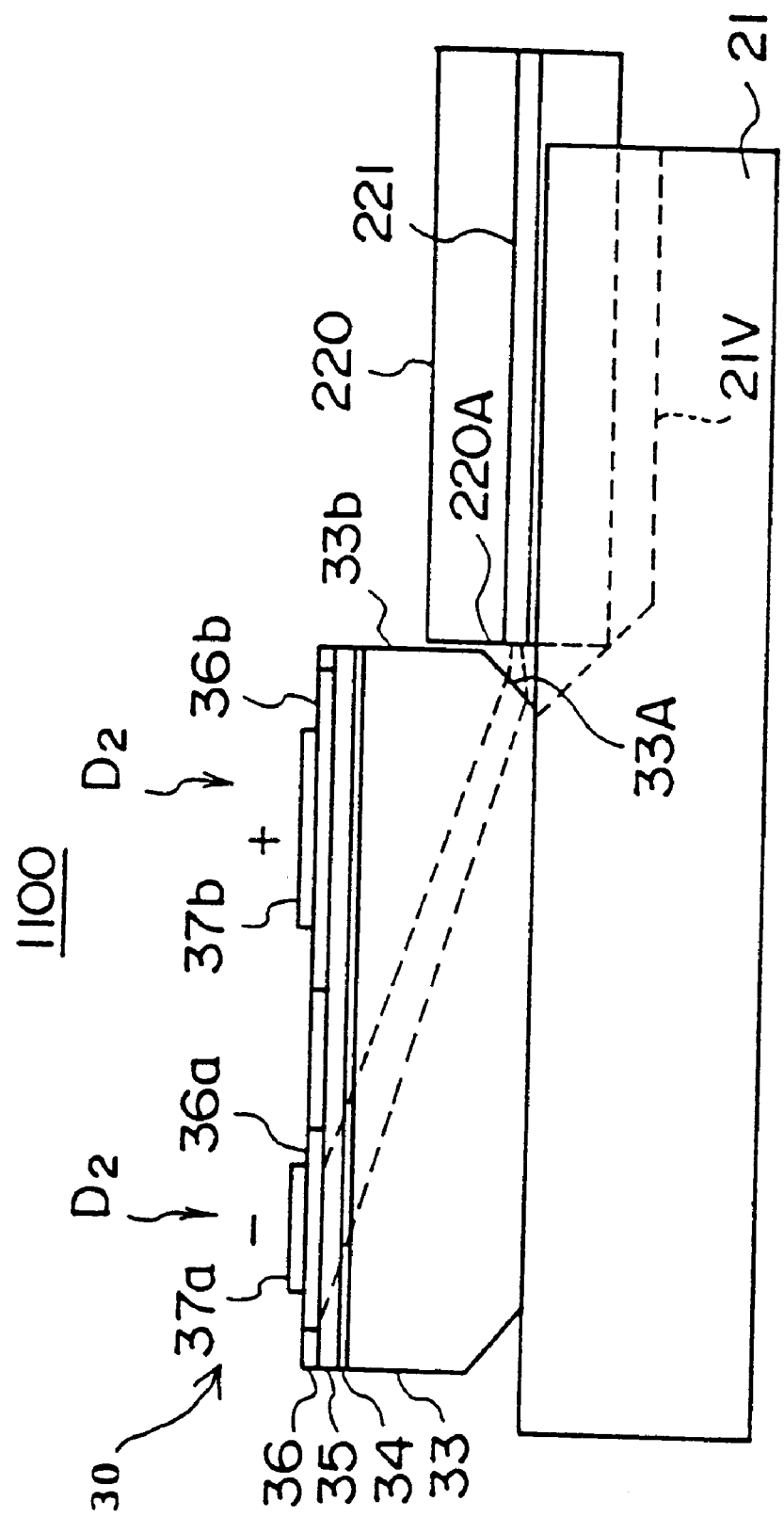
FIG. 18 is a diagram showing the construction of an optical module according to a tenth embodiment of the present invention.

FIG. 18 shows the construction of an optical module 1100 according to a tenth embodiment of the present invention.

Referring to FIG. 18, the optical module 1100 includes the support substrate 21 that carries thereon the photoreception device 30 similarly to the optical module 300 of FIG. 6, except that the support substrate 21V is formed with a V-shaped groove 21 on the principal surface thereof for engagement with an optical fiber 220 that includes an optical core 221.

In such a structure, the optical beam in the core 221 impinges upon the prism surface 33A of the device substrate 33 and experiences a refraction similarly to the case of the optical module 300 of FIG. 6, wherein the optical beam thus refracted hits the diffusion region 36a forming the photodiode D2. It should be noted that such a V-shaped groove is formed easily on a Si substrate by a well known etching process that uses KOH as an etchant. In this case, the V-shaped groove is defined by a pair of crystal surfaces of Si.

Further, the present invention is not limited to the embodiments described heretofore, but various variations and modifications may be made without departing from the scope of the invention.

What is claimed is:

1. A method for fabricating a photodetection module, comprising the steps of:

forming a layered body on a top surface a substrate such that said layered body includes an active layer;

forming a plurality of photoreception region on said layered body;

forming a V-shaped groove on a bottom surface of said substrate by an etching process, such that said V-shaped groove separates one photoreception region from another photoreception region;

dividing said layered body and said substrate along said V-shaped groove by a cleaving process to form a plurality of photoreception elements, such that each of said photoreception elements has an oblique surface in correspondence to side walls of said V-shaped groove; and disposing said photoreception device upon a support substrate carrying thereon an optical waveguide, such that said oblique surface faces an edge surface of said optical waveguide.

2. A method as claimed in claim 1, wherein said etching process is conducted by a wet etching process such that said V-shaped groove is defined by a pair of crystal surfaces.

* * * * *